United States Patent [19]

Kondo

[11] Patent Number: 5,145,055
[45] Date of Patent: Sep. 8, 1992

[54] DEVICE FOR CONVEYING PRINTED CIRCUIT BOARD

[75] Inventor: Kenshi Kondo, Tokyo, Japan

[73] Assignee: Nihon Den-Netsu Keiki Co., Ltd., Japan

[21] Appl. No.: 757,804

[22] Filed: Sep. 11, 1991

[30] Foreign Application Priority Data

Oct. 8, 1990 [JP] Japan .................. 2-268520

[51] Int. Cl.$^5$ ............................... B65G 29/00
[52] U.S. Cl. .................. 198/803.9; 198/817
[58] Field of Search ............. 198/470.1, 817, 803.9, 198/626.1, 626.6

[56] References Cited

U.S. PATENT DOCUMENTS

| | | | |
|---|---|---|---|
| 771,641 | 10/1904 | Huber et al. | 198/836.1 |
| 3,369,306 | 2/1968 | Evans | 198/626.1 X |
| 3,454,142 | 7/1969 | Holstein | 198/626.1 |
| 3,809,210 | 5/1974 | Anderson | 198/817 X |
| 4,542,820 | 9/1985 | Maxner | 198/817 |
| 4,570,785 | 2/1986 | Lewanski et al. | 198/626.6 |
| 4,672,914 | 6/1987 | Sari | 198/817 X |
| 4,779,717 | 10/1988 | Eberle | 198/803.9 X |
| 4,874,081 | 10/1989 | Kondo | 198/803.9 |
| 5,029,696 | 7/1991 | Van Tilburg | 198/626.1 |

Primary Examiner—Robert P. Olszewski
Assistant Examiner—James R. Bidwell
Attorney, Agent, or Firm—Lorusso & Loud

[57] ABSTRACT

A printed circuit board transferring device is disclosed which includes a pair of endless roller chains defining a printed circuit board transferring path therebetween, a plurality of support members fixed to the chains for movement therewith and each adapted to support printed circuit boards thereon, a clamp plate member provided on each of the support members and moveable between close and open positions, and an engaging member provided both ends of the transfer path and engageable with upper surface of the clamp plate members to maintain the clamp plate members in the open positions, so that the printed circuit boards supported on the supporting members are clamped between the supporting members and the clamp plate members during the non-engagement of the clamp plate members with the engaging member.

4 Claims, 9 Drawing Sheets

F I G. 1
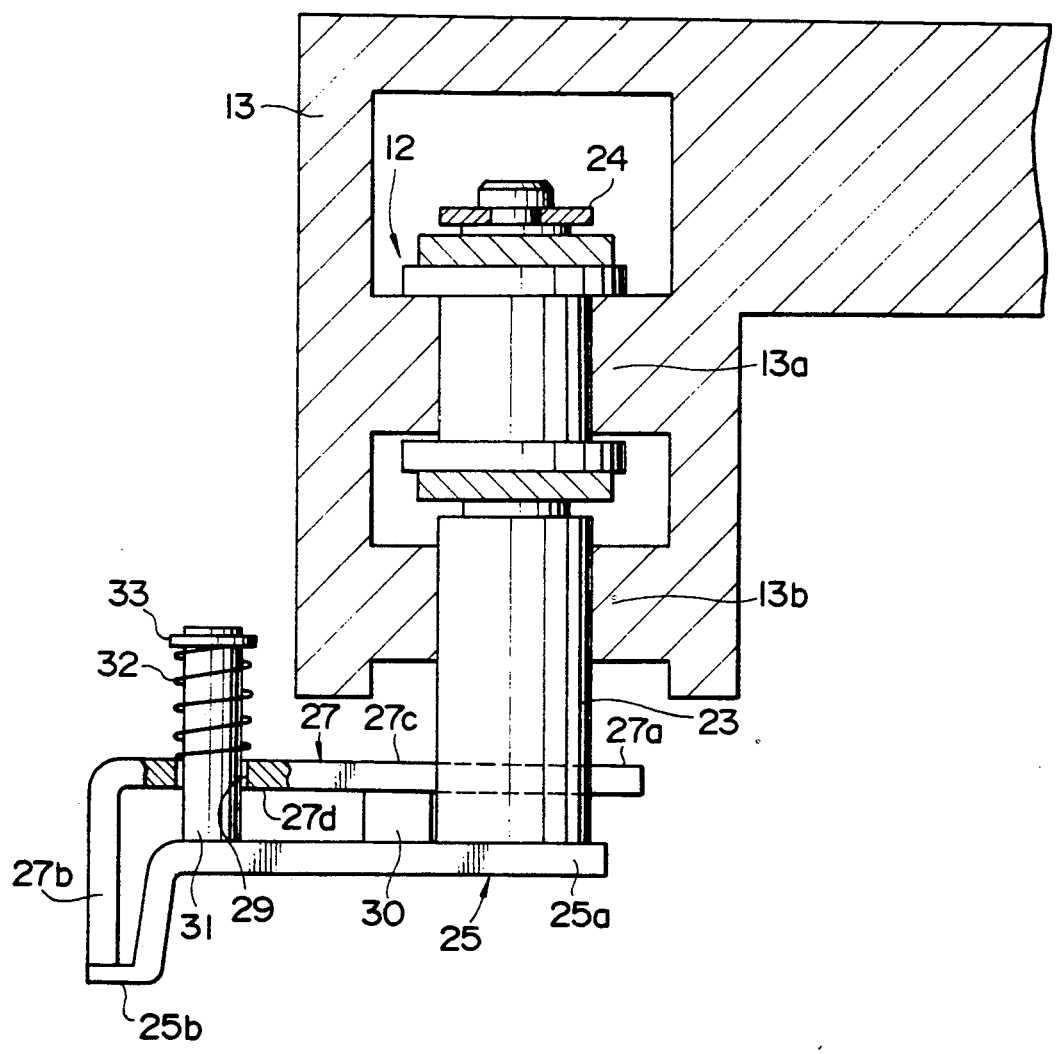

DEVICE FOR CONVEYING PRINTED CIRCUIT BOARD

This invention relates generally to a device for conveying printed circuit boards and, more specifically, to a device having a pair of endless conveyor chains adapted to support printed circuit boards directly thereon without employing carriers and to transfer same through a predetermined path of travel for effecting soldering.

U.S. Pat. No. 4,874,081 discloses a printed circuit board conveying device for such a "carrierless" soldering apparatus as shown in FIGS. 9–11 of the accompanying drawings. The device includes a pair of endless roller chains 2 each guided by a guide rail 3 to define a printed circuit board transferring path 4 therebetween. A plurality of support members 5 are fixed to the chains 2 for movement therewith and are each adapted to support printed circuit boards 1 thereon. A clamp plate member 6 is provided on each of the support members 5 and is moveable between close and open positions. Each of the support members 5 is provided with a spring member 7 to normally urge the clamp plate member 6 in the open position as shown by the solid line in FIG. 9. Provided on both sides of the transfer path 4 are engaging plates 8 engageable with upper surfaces of the clamp plate members 6 to maintain the clamp plate members 6 in the close positions as shown by the two dotted lines in FIG. 9, so that the printed circuit boards 1 supported on the supporting members 5 are clamped between the supporting members 5 and the clamp plate members 6 during the engagement of the clamp plate members 6 with the engaging plates 8.

The above known device has been found to involve the following problems. Firstly, since the clamp plates 6 are held in sliding contact with the engaging plates 8 during their passage through substantially the full length of the conveying path 4, a high load is put on the conveyer chains 2. Secondly, it is troublesome and time consuming to adjust the level of the engaging plates 8. The level adjustment of the engaging plates 8 plays an important role in properly clamping the printed circuit boards with various thicknesses between the support plate 5 and the clamp plate 6.

The present invention has been made to solve the above problems of the conventional device. In accordance with the present invention there is provided a device for conveying printed circuit boards, comprising:

a pair of spaced apart, endless roller chains defining therebetween a printed circuit board transferring path having feed portion at which printed circuit boards are fed to said path and a delivery portion at which the printed circuit boards conveyed along said path are delivered;

a plurality of support members fixed to said chains for movement therewith and each adapted to support thereon a side edge portion of a printed circuit board, so that the printed circuit board can be transferred along said path with opposite side edge portions thereof being supported on the support members;

a clamp plate member rockably supported on each of said support members and adapted to move between a close position where said clamp plate member is engageable with an upper surface of the side edge portion of the printed circuit board supported on the support members and an open position where said clamp plate member is incapable of engaging with the printed circuit board;

means provided on each of said support members for urging the corresponding clamp plate member to rotate in a direction so that the clamp plate member is normally maintained in the closed position; and engaging means disposed adjacent to each of said feed and delivery portions of said transfer path and having a lower surface engageable with upper surfaces of the clamp plate members to maintain the clamp plate members in the open positions, whereby the printed circuit board can be placed on said support members at said feed portion, clamped between the supporting members and the clamp plate members during the nonengagement of the clamp plate members with the engaging means and delivered at said delivery portion.

The present invention will now be described in detail below with reference to the accompanying drawings, in which:

FIG. 1 is a fragmentary, elevational view partly in cross section showing one embodiment of the printed circuit board conveying device according to the present invention;

Figure 7:
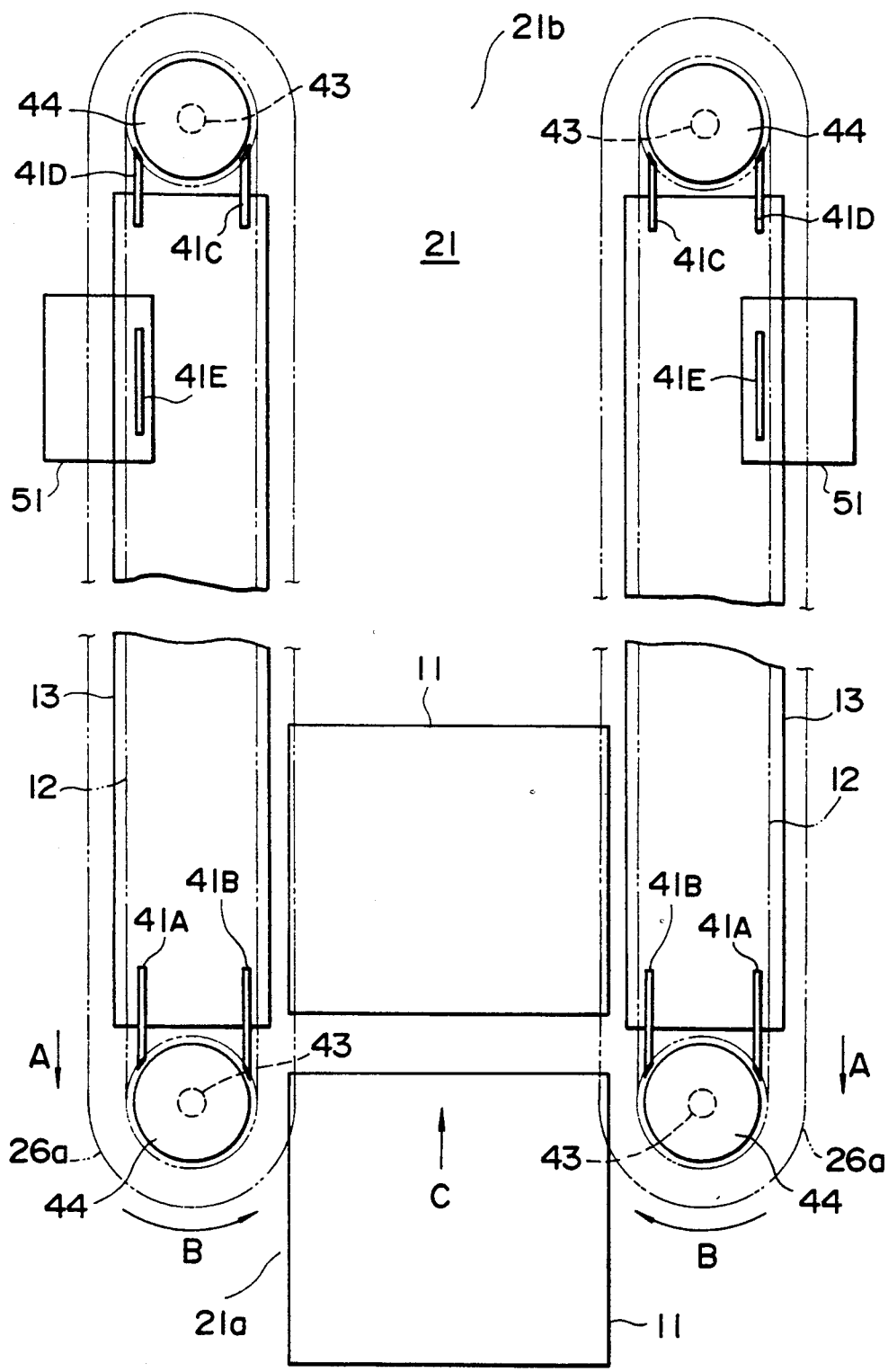
FIG. 7 is a partial top view 9 of the device of FIG. 1.
Figure 8:
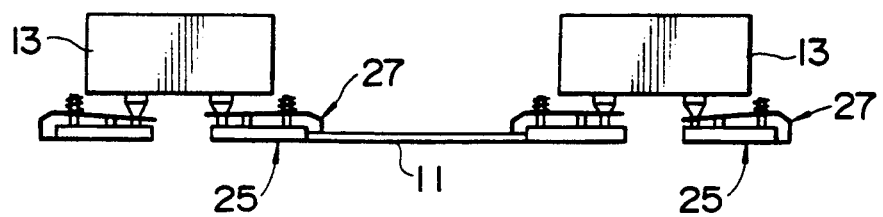
FIG. 8 is a diagrammatical front view of FIG. 7.

Referring now to the drawings and first to FIGS. 7 and 8, designated as 12 are a pair of spaced apart, endless roller chains each guided by a guide rail 13 to define a printed circuit board conveying path 21 between the roller chains 12. The chains 12 are driven in a manner known per se by a pair of sprocket wheels 42 (FIG. 5) each supported about a shaft 43. The conveying path 21 has a feed portion 21a from which printed circuit boards 11 are successively fed to the path 21 and a delivery portion 21b from which they are successively delivered therefrom. A plurality of support members 25 are fixed to both chains 12 for movement therewith. Thus, when the chains 12 are moved upon driving of sprockets (not shown) in the directions B, each of the support members 25 is also moved along a path 26a. Each of the support members 25 is adapted to support thereon a side edge portion of a printed circuit board 11 which has been introduced into the transfer path 21 by any suitable means (not shown). As a result, the printed circuit board 11 can be transferred through the path 21 with opposite side portions thereof being in supporting engagement with the support members 25 in the direction shown by the arrow C.

A clamp plate member 27 is rockably mounted on each of the support members 25 and is adapted to move between open and close positions upon rocking movement of thereof. Each clamp plate member 27 is cooperable with the corresponding support member 25 to clamp the side edge portion of the printed circuit board 11 therebetween when the clamp plate member 27 is in the close position.

Figure 2:
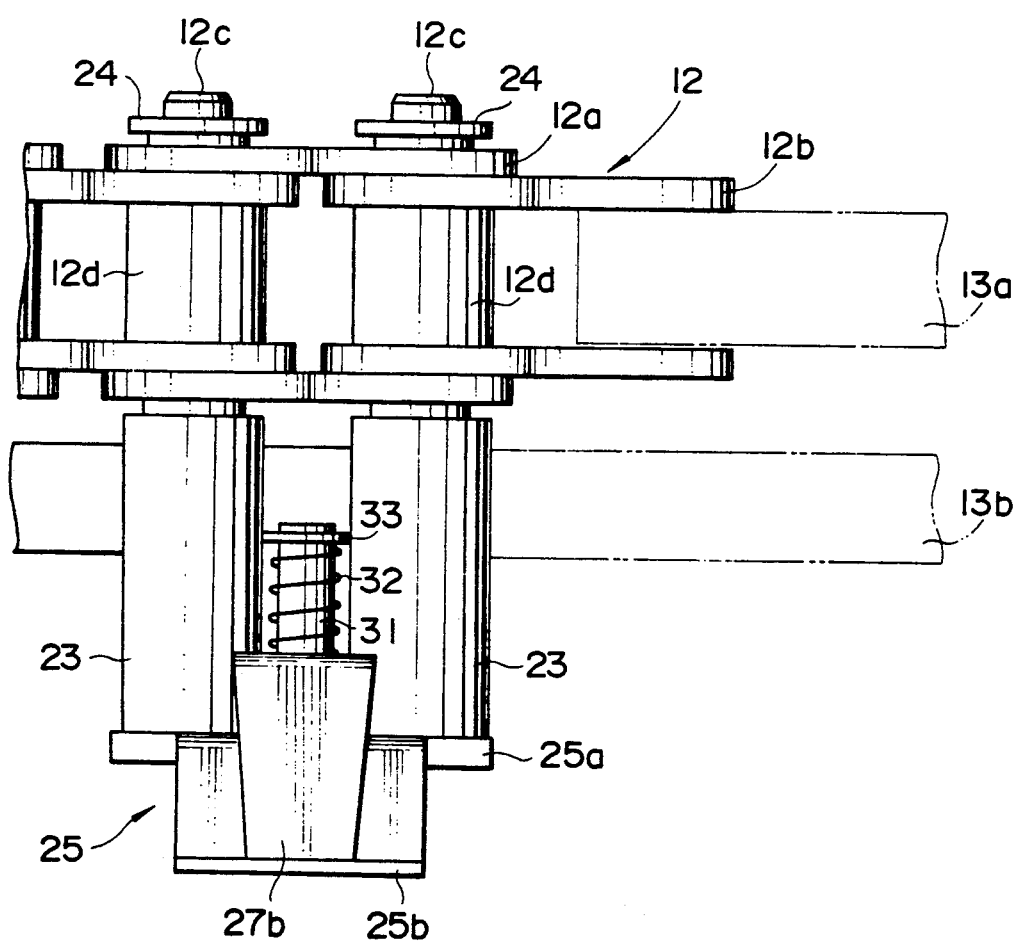
FIG. 2 is a fragmentary, side elevational view of the device of FIG. 1.

A preferred structure of the support member 25 and clamp plate member 27 is specifically illustrated in FIGS. 1 and 2. As best seen from FIG. 2, each of the chains 12, which has a conventional structure, includes a multiplicity of outside link plates 12a and the same number of inside link plates 12b which are alternately rotatably connected by pins 12c. Designated as 12d are rollers which are in rolling contact with a chain guide 13a of the guide rail 13.

Each of the support members 25 in this embodiment includes a pair of vertical connecting rods 23 having their upper ends fixedly connected to a pair of neighboring pins 12c of the chain 12. Designated as 24 are clips for securing the rods 23 to the pins 12c. A horizontal support plate 25a is connected to lower ends of each pair of the connecting rods 23 and has an end portion 25b adapted to support an edge portion of a printed circuit board. Planted on the support plate 25a is a pin 31.

Each of the clamp plate members 27 in this embodiment has a base portion 27a extending between and protruded from the two rods 23, a first intermediate portion 27c extending from the base portion 27a, a second intermediate portion 27d extending from the first intermediate portion and provided with a through hole 29 which is loosely fitted, and a tip end portion 27b cooperable with the end portion 25b of the support member 25a to clamp a printed circuit board therebetween. A spring 32 is provided around the pin 31 and is diposed between the clamp member 27 and a stopper 33 secured to the pin 31 to act on an upper surface of the clamp plate member, so that the clamp member 27 is normally maintained in the close position where the tip end portion 27b of the clamp member 27 is able to be in pressure contact with the upper surface of the printed circuit board supported on the support member 25.

Figure 3:
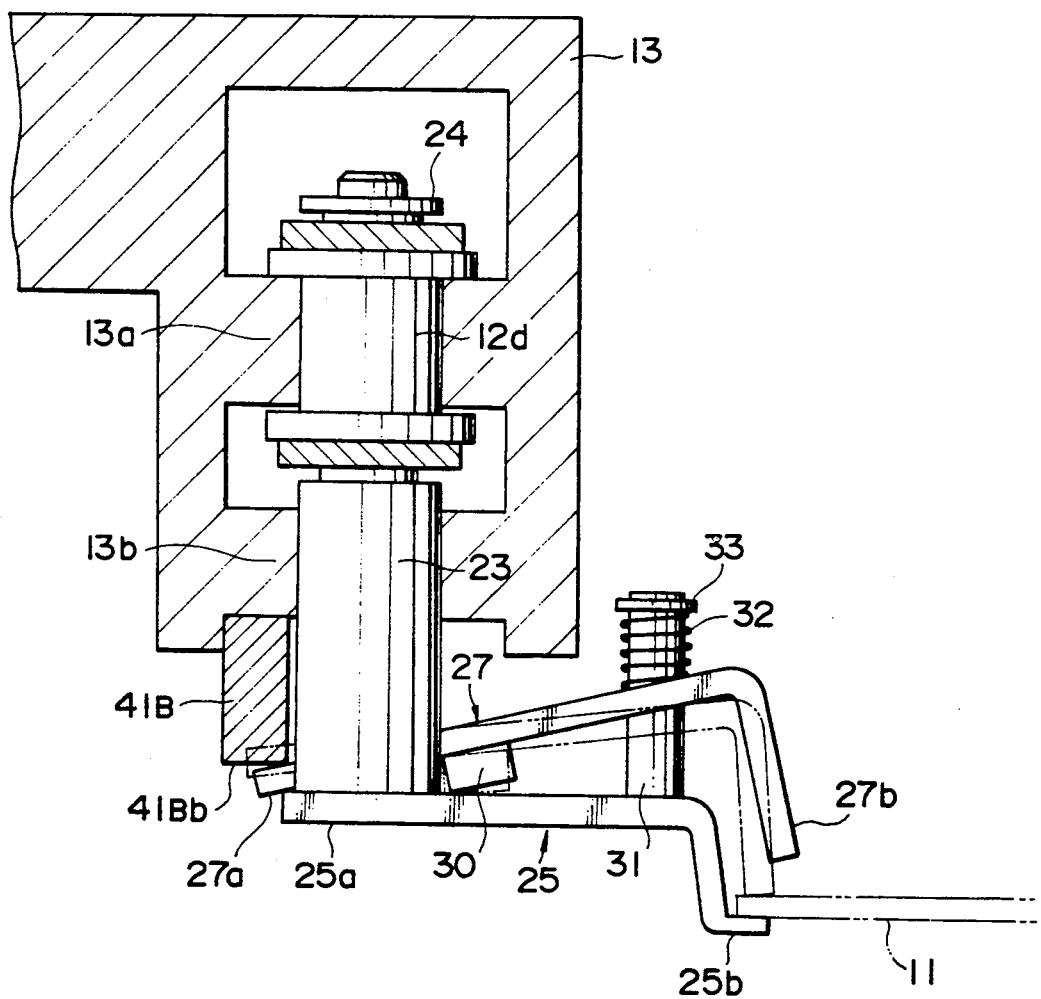
FIG. 3 is a fragmentary, elevational view, similar to FIG. 1, showing the operation of the device of FIG. 1.

Designated as 30 is a seating disposed between the support plate 25a and the first intermediate portion 27c of the clamp plate member 27. The seating 30 may be fixed to either the support plate member 25 or the clamp plate member 27. When the base portion 27a of the clamp plate member 27 is pushed down in a manner as described hereinafter, the clamp member 27 is rotated against the force of the spring 32 with the seating 30 as a center of rotation, whereby the clamp plate member 27 is shifted to its open position as shown in FIG. 3.

As shown in FIG. 7, to maintain the clamp plate members 27 in the open positions when the printed circuit boards are fed to the conveying path 21 and when the conveyed boards are delivered from the path 21, engaging plates 41A, 41B, 41C and 41D and engaging discs 44 engageable with an upper surface of the base portion of 27a of each of the clamp plate member 27 are provided adjacent to the feed and delivery portions 21a and 21b of the conveying path 21.

Figure 4:
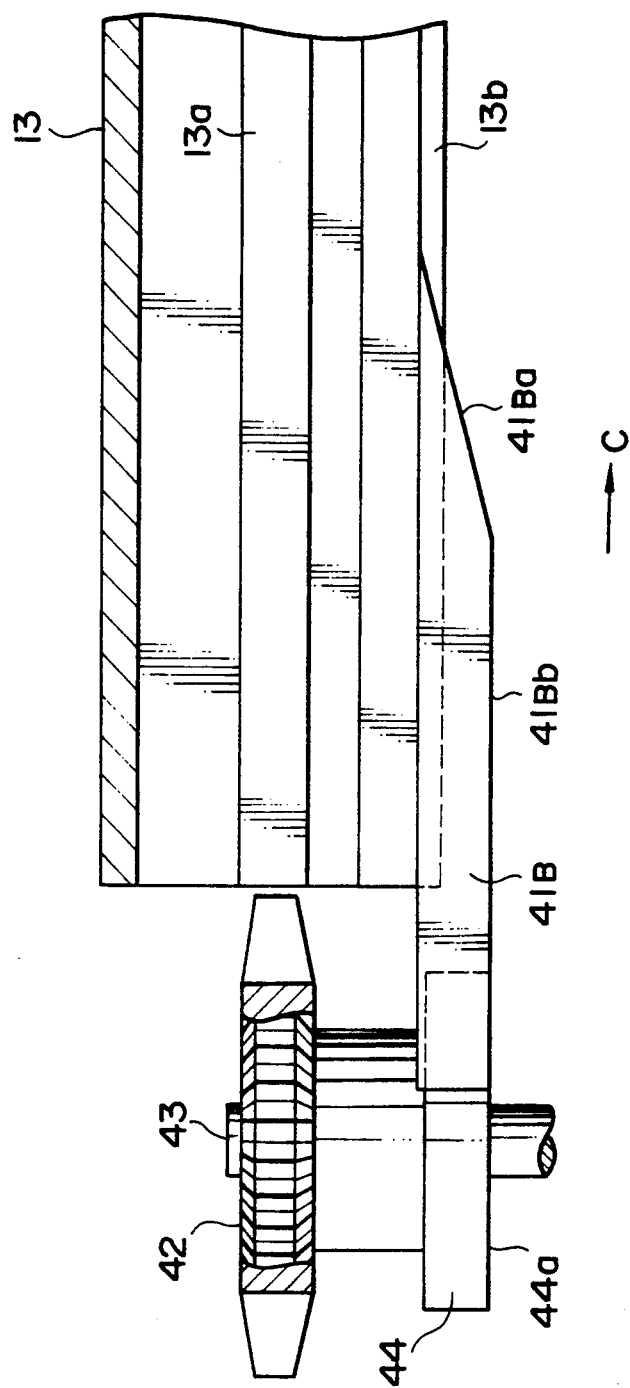
FIG. 4 is an enlarged, fragmentary, elevational view of an arrangement of an engaging plate and an engaging disc of the device of FIG. 1.

In the illustrated embodiment, the engaging plates 41A–41D have the same structure and, therefore, the following explanation will be made only with respect to the engaging plate 41B. Referring to FIGS. 3 and 4, the engaging plate 41B is fixedly secured to the guide rail 13 and has a lower surface 41Bb engageable with an upper surface of the base portion 27a of the clamp plate member 27. The level of the lower surface 41Bb of the engaging plate 41B is so adjusted that when the the lower surface 41Bb is engaged by the upper surface of the base portion 27a of the clamp plate member 27, the clamp plate member 27 is maintained in the open position. A tapered portion 41Ba is formed to ensure smooth, gradual disengagement or engagement of the clamp plate member 27 from or with the engaging plate 41B.

Figure 5:
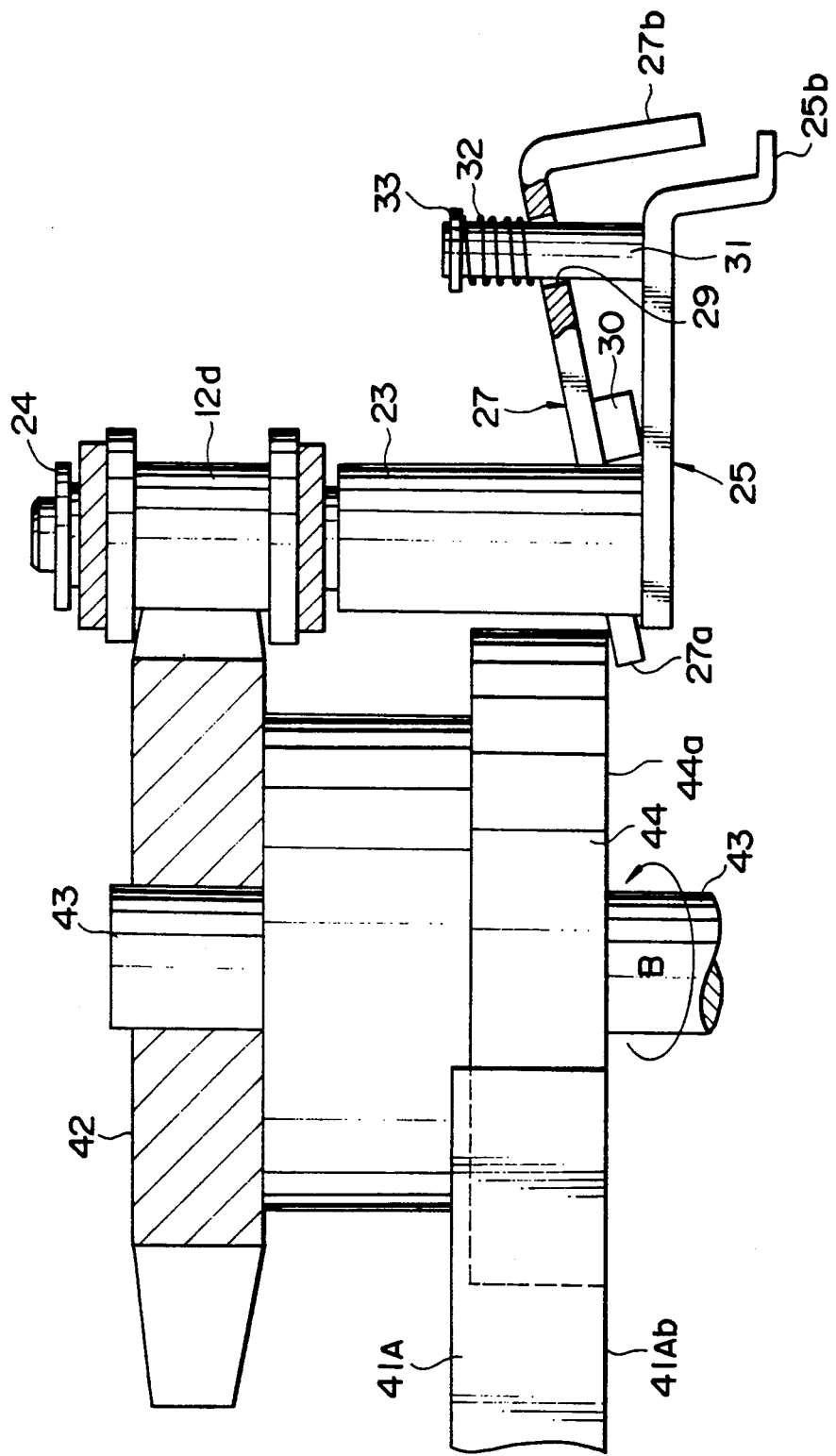
FIG. 5 is an enlarged, fragmentary, elevational view showing the operation of the engaging disc of FIG. 4.
Figure 6:
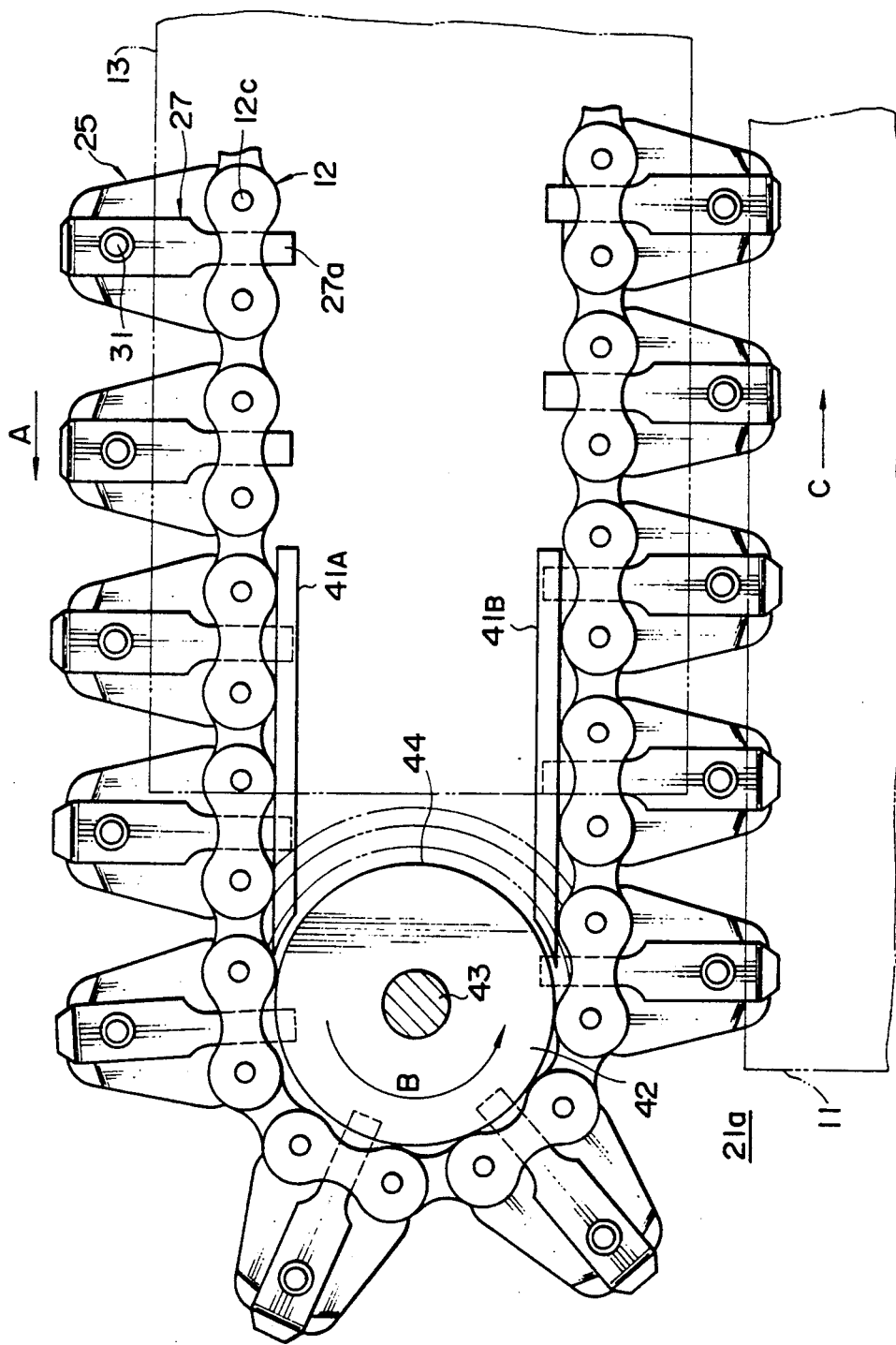
FIG. 6 is an enlarged fragmentary top view showing the operation of the device of FIG. 1 in the printed wiring board feed portion.

As shown in FIG. 4, each of the engaging discs 44 is provided on the shaft 43 of each of the sprocket wheels 42 for rotation therewith. Each of the engaging disc 44 has a lower surface 44a whose position is adjusted to the same level as that of the lower surface 41Bb of the eangaging plate 41B. Thus, as shown in FIG. 5, when the the lower surface 44a of the engaging disc 44 is engaged by the upper surface of the base portion 27a of the clamp plate member 27, the clamp plate member 27 is maintained in the open position. In FIG. 7, the engaging plates 41A and 41C serve to function as guides to permit the engaging discs 44 to be smoothly brought into engagement with the upper portion of the clamp plate members 27, while the engaging plates 41B and 41D serve to function as guides for smooth and gradual rocking movement of the clamp clamp plate members 27 to their close positions.

As a result of the above construction, during the passage of each of the clamp plate members 27 through the feed and delivery portions 21a and 21b, the base portion 27a thereof is engaged by the engaging plates 41A–41D and engaging discs 44 and is pushed down, so that the clamp plate member 27 is maintained in the open position.

In FIG. 7, designated as 51 is a cleaning station where the tip end portion 27b of the clamp plate member 27 and the end portion 25b of the support member 25a, between which printed wiring boards are to be nipped, are cleaned with any suitable means, such as brushes impregnated with a cleaning liquid. To achieve this purpose, an engaging plate 41E is mounted adjacent to the cleaning station to maintain the clamp plate member 27 in the open position in the same manner as described with respect to the engaging plate 41B.

The above-described printed circuit board conveying device operates as follows.

Printed circuit boards are intermittently fed to the feed portion 21a of the transfer path 21 (FIG. 7). In this case, since the clamp plate members 27 are in engagement with the engaging discs 44 in the upstream end portion 21a of the transfer path 21, the plate members 27 are maintained in the open positions as shown in FIG. 5, thereby to permit the feeding of the printed circuit boards 11 on the end portions 25b of the support members 25. The printed circuit board 11 is then transferred in the direction C (FIG. 7) with its opposite side edges being supported on the support members 25.

As the printed circuit board further advances along the transfer path 21, the upper surfaces 27a of the clamp plate members 27 are brought into engagement with the lower sufaces 41Bb of the engaging plates 41B and then with the tapered portion 41Ba of the engaging plages 41B. This causes the clamp plate members 27 to be lowered by the action of the spring 32. Thus, the end portions 27b are brought into contact with the upper surface of the printed circuit board 11 as shown by the two-dotted line in FIG. 3. As a result, the two side edge portions of the printed circuit board 11 are resiliently clamped between the tip end portions 27b of the clamp plate members 27 and the end portions 25b of the supporting members 25.

Thus, the printed circuit board 11 is conveyed along the transfer path 21 and is soldered in a soldering station (not shown) in a conventional manner. When the board 11 is transferred to the delivery portion 21b, the clamp plate members 27 are engaged by the engaging plates 41c so that the end portions 27b of the clamp members 27 are disengaged from the printed circuit board 11 to permit the release thereof from the end portions 25b of the support plates 25.

Figure 9:
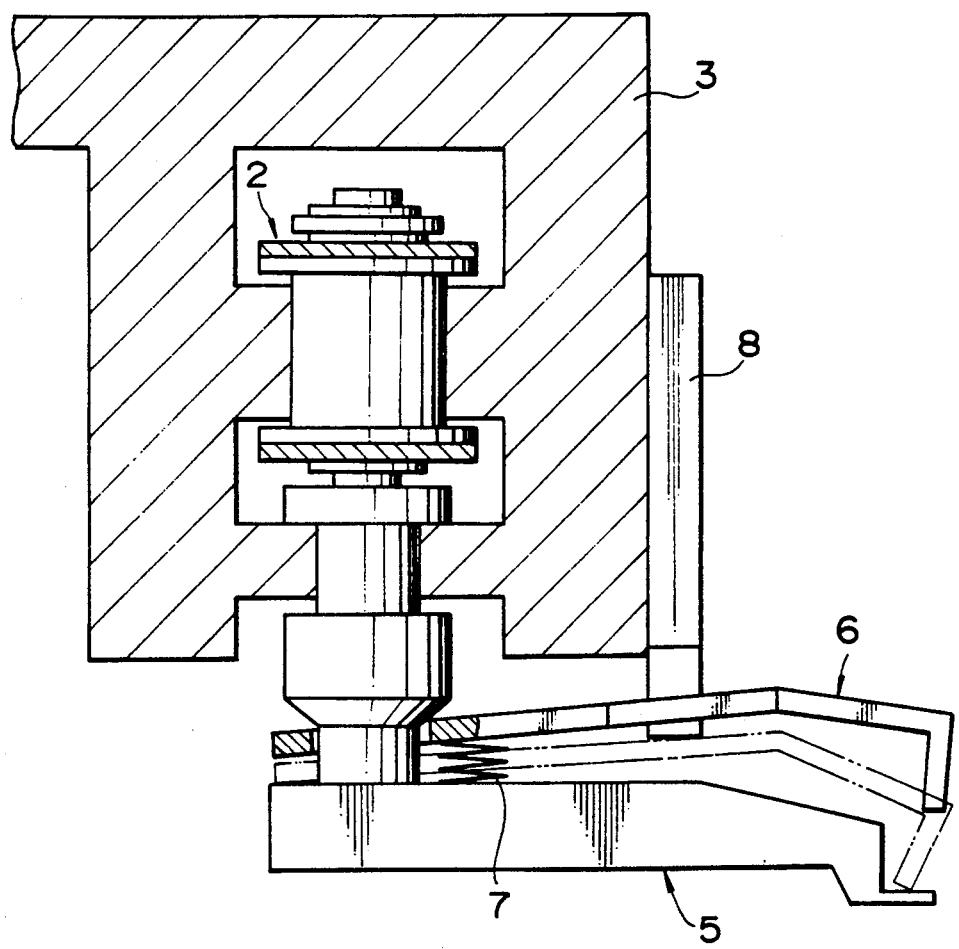
FIG. 9 is a fragmentary elevational view, similar to FIG. 1, showing a conventional printed circuit board conveying device for a carrierless soldering apparatus.
Figure 10:
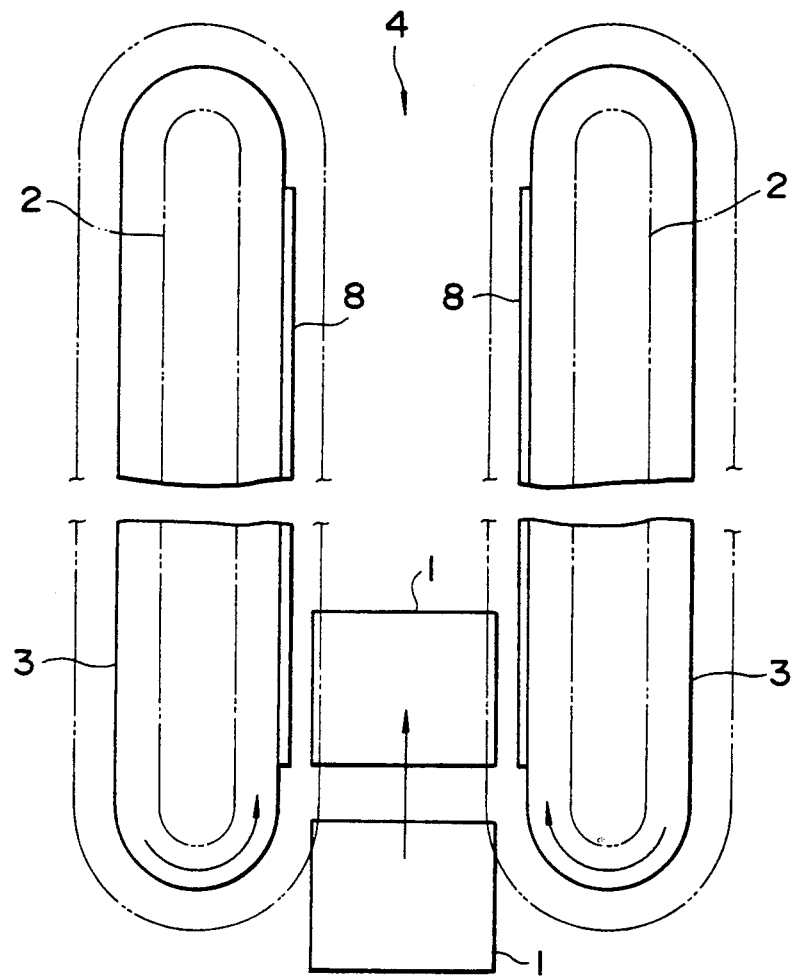
FIG. 10 is a top view, similar to FIG. 7, of the conventional device of FIG. 9.
Figure 11:
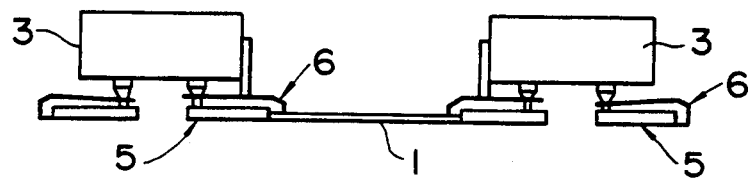
FIG. 11 is a front view, similar to FIG. 8, of FIG. 10.

As will be understood from the foregoing, the engagement of the clamp plate members 27 with the engaging plates 41A–41D and the engaging discs 44 is made only in the printed circuit board feed portion 21a and delivery portion 21b in the long transfer path 21 so that the torque required for transferring the boards 11 along the path 21 can be reduced in comparison with the conventional device. Additionally, it is no longer necessary to conduct adjustment of the position of engaging plates as required in the conventional device of FIGS. 9–11.

What is claimed is:

1. A device for conveying printed circuit boards, comprising:
    a pair of spaced apart, endless roller chains defining therebetween a printed circuit board transferring path having feed portion at which printed circuit boards are fed to said path and a delivery portion at which the printed circuit boards conveyed along said path are delivered;
    a plurality of support members fixed to said chains for movement therewith and each adapted to support thereon a side edge portion of a printed circuit board, so that the printed circuit board can be transferred along said path with opposite side edge portions thereof being supported on the support members;
    a clamp plate member rockably supported on each of said support members and adapted to move between a close position where said clamp plate member is engageable with an upper surface of the side edge portion of the printed circuit board supported on the support members and an open position where said clamp plate member is incapable of engaging with the printed circuit board;
    means provided on each of said support members for urging the corresponding clamp plate member to rotate in a direction so that the clamp plate member is normally maintained in the closed position; and
    engaging means disposed adjacent to each of said feed and delivery portions of said transfer path and having a lower surface engageable with upper surfaces of the clamp plate members to maintain the clamp plate members in the open positions, whereby the printed circuit board can be placed on said support members at said feed portion, clamped between the supporting members and the clamp plate members during the non-engagement of the clamp plate members with the engaging means and delivered at said delivery portion.

2. A device as set forth in claim 1, wherein each of said support members includes a pair of vertical connecting rods each having an upper end connected to said chain, and a horizontal support plate connected to the other, lower ends of said connecting rods and having an end portion adapted to support a side edge portion of the printed circuit board.

3. A device as set forth in claim 2, wherein each of said supporting members further includes a pin planted on the support plate thereof,
    wherein each of said clamp plate members has a base portion having a contact portion at its upper surface engageable with the engaging means, a first intermediate portion extending from said base portion, a second intermediate portion extending from said first intermediate portion and provided with a through hole into which the pin of the corresponding support member is loosely fitted, and a tip end portion arranged to be in pressure contact with an upper surface of a side edge portion of the printed circuit board supported on the end portion of the corresponding support member, and
    wherein each of said urging means includes a spring provided around the pin of the corresponding support member to act on an upper surface of the second intermediate portion of the corresponding clamp plate member, so that said tip end portion is maintained in pressure contact with the upper surface of the printed circuit board during the non-engagement of the clamp plate member with the engaging means,
    said device further including a seating disposed between the support plate and the clamp plate member of the corresponding supporting member and positioned in said first intermediate portion of the corresponding supporting member, so that each of said clamp plate members is rockable with the seating as a center of rotation.

4. A device as set forth in claim 1, wherein each of said pair of endless conveyer chains extends between a pair of first and second sprocket wheels and is driven by rotation thereof so that said feed portion and said delivery portion are defined between the two, first sprocket wheels and the two, second sprocket wheels, respectively, wherein said engaging means located in said feed portion includes a first engaging disc fixed to each of said first sprocket wheels for rotation therewith, and a pair of engaging plate members disposed adjacent to each of said first engaging discs and extending in parallel with said transfer path, and wherein said engaging means located in said delivery portion includes a second engaging disc fixed to each of said second sprocket wheels for rotation therewith, and a pair of engaging plate members disposed adjacent to each of said second engaging discs and extending in parallel with said transfer path, said first and second engaging discs together with the corresponding pairs of engaging plate members form said lower surface.

* * * * *